Dec. 1, 1970 M. E. GABRIEL 3,544,993

BIPOLAR ANALOG TO DIGITAL ENCODER UTILIZING TWO COMPARATORS

Filed July 10, 1967 2 Sheets-Sheet 1

Inventor
MALCOLM E. GABRIEL
By Alfred C. Hill
Agent

Inventor
MALCOLM E. GABRIEL
By Alfred C. Hill
Agent 3,544,993

BIPOLAR ANALOG TO DIGITAL ENCODER UTILIZING TWO COMPARATORS

Malcolm Edward Gabriel, Basildon, England, assignor to International Standard Electric Corporation, New York, N.Y., a corporation of Delaware Filed July 10, 1967, Ser. No. 652,053
Claims priority, application Great Britain, Aug. 2, 1966, 34,580/66
Int. Cl. H03k *13/06*
U.S. Cl. 340—347 9 Claims

ABSTRACT OF THE DISCLOSURE

A substraction type encoder for bipolar samples incorporating a first comparator for providing coded signals for positive samples and a second comparator for providing coded signals for negative samples. One of the comparators provides an additional code digit whose binary conditions indicates the polarity of the sample. This code digit controls the connection of the proper one of the comparators to the output terminal. A decoder coupled to the output terminal provides a non-linear unidirectional reference signal for each of the comparators. There is thusly provided a non-linear encoder having identical coding characteristics for samples of either polarity.

BACKGROUND OF THE INVENTION

This invention relates to an encoder for sampled analog signals as used for example in a pulse code modulation (PCM) communication system.

The advantages of using encoders having nonlinear transfer characteristics for coding speech signals are well known. When the signals to be coded are bipolar, that is, have an average value of zero, it is essential that the coding characteristic is identical for positive and negative going signals. This is particularly so when a nonlinear coding characteristic is required.

A type of coder frequently used in the PCM art is the feedback subtraction type. See for example "Modulation Theory" by H. S. Black, Van Nostrand Inc. (1953) p. 306. This type of coder can be designed to have a nonlinear coding characteristic provided the signals to be coded are of one polarity only. It is, however, much more difficult to design an encoder for bipolar signals and ensure that the coding characteristic is identical for signals of either polarity.

Prior art arrangements for coding bipolar analog signal samples have employed either a full wave rectifier or a synchronous switch to combine the positive and inverted negative samples and thereby convert the bipolar samples to unipolar samples. These unipolar samples are then applied to a single encoder for coding. These known arrangements have the disadvantage that nonlinear characteristic devices, such as rectifiers, lead to serious encoding distortion of weak signals.

SUMMARY OF THE INVENTION

An object of the present invention is to provide an improved symmetrical subtraction type nonlinear encoder for bipolar analog signal samples.

Another object of this invention is to provide a symmetrical subtraction type nonlinear encoder for bipolar analog signal samples where the positive and negative analog samples are separately encoded and then serially combined in their encoded form.

A further object of this invention is to provide a symmetrical subtraction type nonlinear encoder for bipolar analog signal samples where a linear inversion of the negative polarity samples are performed thereon. The positive and inverted negative samples are then separately coded with these coded outputs being combined at the output terminal on a digital basis by means of logic circuitry which is not amplitude sensitive.

A feature of this invention is the provision of a symmetrical subtraction nonlinear encoder for bipolar sampled analog signals comprising first means coupled to the coded signal output terminal to produce in response to the coded signals unidirectional reference signals and control signals indicative of the polarity of the samples, second means coupled to the sample input terminal and the first means responsive to the samples of a first polarity and the associated ones of the reference signals to provide at least that portion of each of the coded signals representing the magnitude of the sample of the first polarity, third means coupled to the sample input terminal and the first means responsive to the samples of a second polarity opposite to the first polarity and the associated ones of the reference signals to provide at least that portion of each of the coded signals representing the magnitude of the samples of the second polarity, and fourth means coupled to the first means responsive to the control signal to selectively couple the appropriate one of the second and third means to the coded signal output terminal.

Another feature of this invention is the provision of fifth means coupled to the output of both of the second and third means to produce an error signal indicative of any inequality between the characteristics of the second and third means, and sixth means coupled to the fifth means and at least one of the second and third means responsive to the error signal to balance out the inequality.

BRIEF DESCRIPTION OF THE DRAWING

The above mentioned and other features and objects of this invention will become more apparent by reference to the following description taken in conjunction with the accompany drawings, in which.

DESCRIPTION OF THE PREFERRED EMBODIMENT

The term "feedback" as applied to encoding methods implies that some form of decoder, a device to convert from digital to analog form, is used as an integral part of the coder together with an error amplifier and control circuits. The coding characteristic of the encoder is determined by the characteristic of the digital to analog (which will be referred to as D/A) converter.

Figure 1:
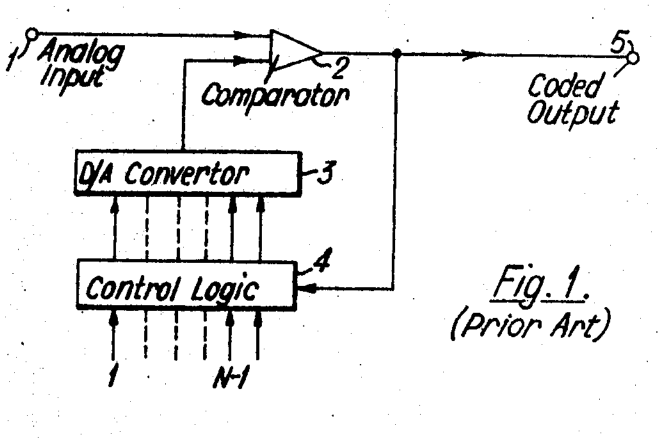
Fig. 1. (Prior Art)
FIG. 1 is a block diagram of a prior art encoder for unipolar analog signal samples.

A block diagram of a prior art encoder for unipolar analog signals is shown in FIG. 1. The sampled analog signals to be encoded are applied via input terminal 1 to an input of amplitude comparator 2 which over a second input is supplied with a reference signal from the output of D/A convertor 3. Under the control of logic circuit 4 which is actuated by clock pulses and by the digits of the coded signal, the amplitude of these reference signals is varied sequentially from a value corresponding to the most significant digit to the least significant digit of the code.

As a result of comparing each sample of the analog signal to be coded with the sequence of reference signals and by making appropriate logical decisions a digital code in serial form is produced at the output of the comparator. For a detailed description of the operation of such an encoder see for example "Pulse Code Modulation", Part 2, by R. L. Carbrey in Electronic Design, Vol. 8, June 22, 1960, pp. 66–69.

Figure 2:
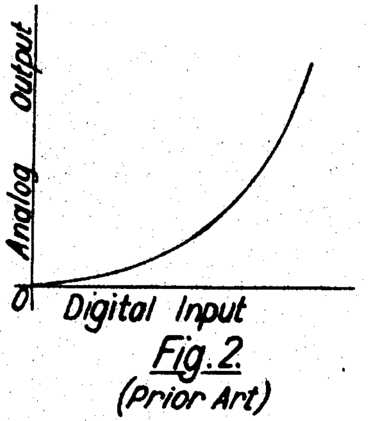
Fig. 2. (Prior Art)
FIGS. 2 and 3 illustrate characteristic curves of the circuit of FIG. 1.
Figure 3:
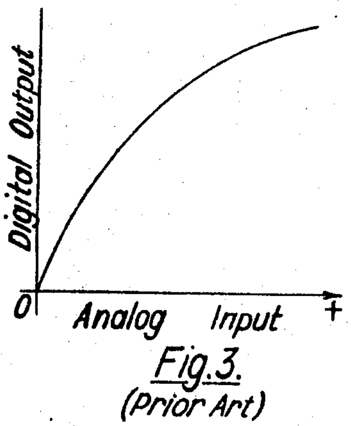
Fig. 3. (Prior Art)

If the coding characteristic of convertor 3 has the shape shown in FIG. 2, the overall characteristic of the encoder will be as shown in FIG. 3. This type of characteristic is not suitable for coding speech signals because it has no symmetry.

Figure 4:
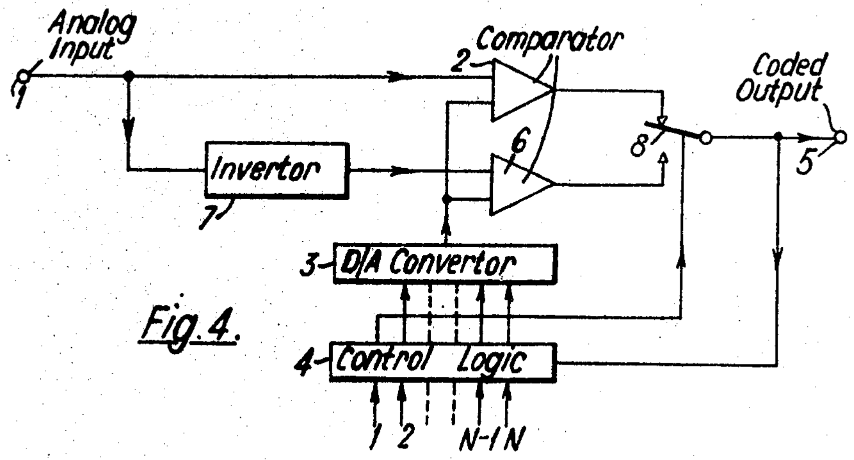
FIG. 4 is a block diagram of an encoder in accordance with the principles of this invention.
Figure 5:
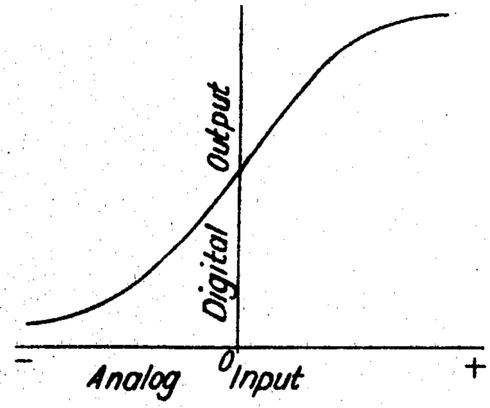
FIG. 5 illustrates the characteristic curve of the encoder of FIG. 4.

The encoder shown in FIG. 4 enables the achievement of a characteristic having the shape shown in FIG. 5, which is symmetric with respect to zero input, but derives this characteristic from a D/A convertor having a characteristic shown in FIG. 2, that is, an unsymmetric characteristic.

The essential difference between the encoders according to FIG. 1 and FIG. 4 is that the latter uses a second comparator 6 in association with signal inverter 7 and changeover switch 8 which for simplicity is shown as a conventional switch. Switch 8 connects the coded outputs of either comparator 2 or 6 to the output terminal 5. One input of each comparator is connected to the unidirectional reference signal obtained from D/A convertor 3. The second input of comparator 2 is connected to the input signal terminal 1 while the second input of comparator 6 is connected to the output of inverter 7 which reverses the polarity of the input signal at terminal 1.

Each comparator is so designed that its output circuit is in one of two possible conditions (mark or space) only when the input signal is more positive than the reference signal.

Thus, assuming that the unidirectional reference signals are positive going pulses, comparator 2 will be coding positive going input signals and comparator 6 will be coding negative going signals.

Since in the encoder of FIG. 4, the D/A converter output is compared only to the deviation of the input signal from zero, the number of quantizing steps of the converter is only one half of the number required of the encoder. In other words, if the analog signal is to be encoded into an $n$ digit code, D/A converter 3 will have $(n-1)$ stages. The binary condition of the first digit of a symmetrical binary code represents the polarity of the input signal when zero input signal is taken as the center of the total range of codes to be generated. The first digit of the code is determined by examining the output of one comparator when D/A converter 3 is zero. Either comparator will give an indication of the polarity of the input signal and it does not matter which is assigned to make this decision, but as they have opposite sense outputs, the decision must always be taken on the same comparator to obtain consistent indication. The result of this decision not only generates the first digit of the code but also actuates switch 8 thereby connecting the output of the correct comparator to terminal 5.

Assuming switch 8 to be in the position shown in FIG. 4, then, if the following sample to be coded is positive the switch remains in the same position. If, however, the sample is negative switch 8 changes over the comparator 6.

At the end of each coding process switch 8 is reset to comparator 2, so that the polarity digit of the next sample can be determined. It will be evident that whatever transfer characteristic D/A converter 3 may possess, the overall transfer characteristic of the encoder will be symmetrical about zero input signal.

Certain requirements which are essential for the correct operation of the symmetrical coder according to FIG. 4 and means to achieve them will now be described.

The biasing of the comparator input circuits must be so arranged that when the input signal and the reference signal are both zero, the output of the comparator must be on the threshold between the two conditions. If this is not the case center clipping or expansion of the coding characteristic will take place.

Referring to FIG. 4, when D/A converter 3 output is zero, then the comparator outputs should always be "mark" and the other "space" regardless of the input signal amplitude. If there is a differential offset between the two comparators of magnitude $v_c$, then for all input signal amplitudes less than $v_c$ the comparator outputs will be of the same sense, that is, either both "marks" or both "spaces."

The symmetrical coder of FIG. 4 is, therefore, provided with means to detect when the outputs of the two comparators have the same sense and to change the bias of one of the comparators to reduce the magnitude of the offset.

If means are available to present an accurate zero input reference to the encoder at certain intervals, then a periodic check of the offset can be carried out and the result of these checks used to correct the bias. An example of such an instance is a PCM multiplex system in which one channel period is used to transmit synchronizing information. Usually in such a system a zero reference is already provided during this channel period in order to align the compression characteristic of the encoder to the input signal.

Figure 6:
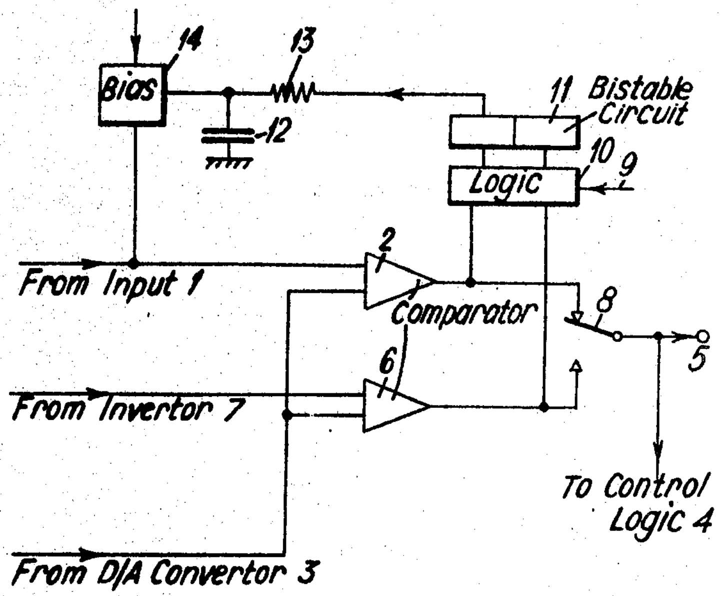
FIG. 6 is a block diagram of the encoder characteristic inequality balancing arrangement employed with the circuit of FIG. 4.

The bias correcting circuit is shown in FIG. 6.

At the time it is desired to inspect the comparators, a pulse is applied via conductor 9 to the logic circuit 10 which gates the comparator outputs and permits logical inspection. The circuit is arranged so that bistable circuit 11 is set to one condition if both outputs are "mark" and to the other condition if they are "space." When the outputs of the comparators are complementary they have no effect on the state of the bistable circuit. The output of the bistable is integrated by resistor-capacitor network 12, 13. The voltage across capacitor 12 is employed to control the bias of one of the comparators by means of control circuit 14, which might be a variable voltage, or a variable current device. The correction bias is, therefore, continuously varying; slowly increasing when the bistable is in one condition and slowly decreasing when it is in the other condition. The differential offset between the comparators is, therefore, also varying, the amplitude of the variations depending on the time constant of the integrating network, the interval between the inspections and the transfer gain of the bias control circuit. The time constant of the integrating network should be chosen to exceed the time interval between successive inspections.

With this arrangement, it is also possible to check the offset of the comparators when no free time period is available to present a zero reference to the encoder.

As previously stated, when the output of D/A converter 3 is zero, then the output of the two comparators should be of opposite sense, no matter what the amplitude of the input signal is. However, offset can only be detected when the input signal amplitude is less than the differential offset. At the beginning of the coding process of any input samples, that is, when the polarity decision is being made, D/A converter 3 output is zero, so that any offset greater than the particular input sample during this period can be detected. Therefore, in order to limit the amplitude of the differential offset, it is necessary to know the period of time which elapses between input samples of amplitude less than this limit. This time depends on the statistical distribution of amplitude of the input signal. Assume that the average period between instances when the amplitude of the sample falls below the magnitude of the offset is T. Then the time interval between two consecutive "orders" to reverse the setting of bistable circuit 11 will also be T. The magnitude of the interval T will depend on the nature of the signal and can be determined by known statistical methods. Thus, the correction bias will slowly change in one direction until it receives an "order" to reverse its direction, and if the maximum interval between "orders" is T, then it is necessary to arrange the integrating network time constant to be sufficiently large so that during time T the differential offset cannot change by more than the required limit. Therefore, provided the statistical distribution of the input signal amplitudes is such that the time T is not so large as to make the integrating network components impracticable, it is possible to limit the differential offset, even though there is no free time period in the encoding process.

While I have described above the principles of my invention in connection with specific apparatus it is to be clearly understood that this description is made only by way of example and not as a limitation to the scope of my invention as set forth in the objects thereof and in the accompanying claims.

I claim:

1. A symmetrical subtraction type nonlinear encoder for bipolar sampled analog signals comprising:
- an input terminal for said samples;
- an output terminal for coded signals representing at least the magnitude of said samples;
- first means coupled to said output terminal to produce in response to said coded signal unidirectional reference signals and control signals indicative of the polarity of said samples;
- second means coupled to said input terminal and said first means responsive to said samples of a first polarity and the associated ones of said reference signals to provide at least that portion of each of said coded signals representing the magnitude of said samples of said first polarity;
- third means coupled to said input terminal and said first means responsive to said samples of a second polarity opposite to said first polarity and the associated ones of said reference signals to provide at least that portion of each of said coded signals representing the magnitude of said samples of said second polarity;
- fourth means coupled to said first means responsive to said control signals to selectively couple the appropriate one of said second and third means to said output terminal;
- fifth means coupled to the output of both of said second and third means to produce an error signal indicative of any inequality between the characteristics of said second and third means; and
- sixth means coupled to said fifth means and at least one of said second and third means responsive to said error signal to balance out said inequality.

2. An encoder according to claim 1, wherein
- one of said second and third means provides an additional digit for said coded signals having one binary condition to represent said first polarity and the other binary condition to represent said second polarity; and
- said first means responds to the binary condition of said additional digit to produce said control signal.

3. An encoder according to claim 2, wherein
- each of said coded signals include
  - $n$—1 binary digits representing the magnitude of each of said samples, and
  - said additional digit; and
- said first means includes
  - a digital to analog converter having $n$—1 stages to produce said reference signals.

4. An encoder according to claim 3, wherein
- said second means includes
  - a first amplitude comparator coupled to said input terminal and said first means to produce said portion representing the magnitude of said samples of said first polarity; and
- said third means includes
  - an amplitude inverter coupled to said input terminal, and
  - a second amplitude comparator coupled to said inverter and said first means to produce said portion representing the magnitude of said samples of said second polarity.

5. An encoder according to claim 1, wherein
- each of said coded signals include
  - $n$ binary digits; and
- said first means includes
  - a digital to analog converter having $n$—1 stages to produce said reference signals.

6. An encoder according to claim 1, wherein
- said second means includes
  - a first amplitude comparator coupled to said input terminal and said first means to produce said portion representing the magnitude of said samples of said first polarity; and
- said third means includes
  - an amplitude inverter coupled to said input terminal, and
  - a second amplitude comparator coupled to said inverter and said first means to produce said portion representing the magnitude of said samples of said second polarity.

7. An encoder according to claim 1, wherein
- said fifth means includes
  - a bistable circuit,
  - logic circuitry coupled to said bistable circuit and both said second and third means to simultaneously monitor the binary condition of the output signals therefrom at a given time, said logic circuitry producing a first signal to actuate said bistable circuit into a first condition when said monitored output signals are both "marks" and a second signal to actuate said bistable circuit into a second condition when said monitored output signals are both "spaces," and
  - an integrating circuit coupled to said bistable circuit to produce said error signal which is a function of the time said bistable circuit remains in a particular one of said conditions; and
- said sixth means includes
  - seventh means coupled to said integrating circuit and at least one of said first and second means responsive to said error signal to generate a correcting bias.

8. An encoder according to claim 7, wherein
- said second means includes
  - a first amplitude comparator coupled to said input terminal and said first means to produce said portion representing the magnitude of said samples of said first polarity;
- said third means includes
  - an amplitude inverter coupled to said input terminal, and
  - a second amplitude comparator coupled to said inverter and said first means to produce said portion representing the magnitude of said samples of said second polarity;
- said logic circuitry is coupled to the output of both of said first and second comparators; and said seventh means is coupled to at least one of said first and second comparators.

9. An encoder according to claim 8, wherein one of said second and third means provides an additional digit for said coded signals having one binary condition to represent said first polarity and the other binary condition to represent said second polarity; and said first means responds to the binary condition of said additional digit to produce said control signal.

References Cited

UNITED STATES PATENTS

| | | | |
|---|---|---|---|
| 2,811,665 | 10/1957 | McNaney | 340—347 |
| 3,017,626 | 1/1962 | Muller | 340—347 |
| 3,097,338 | 7/1963 | Pinet et al. | 340—347 |
| 3,221,324 | 11/1965 | Margopoulos | 340—347 |
| 3,422,424 | 1/1969 | Belet | 340—347 |

MAYNARD R. WILBUR, Primary Examiner

C. D. MILLER, Assistant Examiner